United States Patent
Chen

(10) Patent No.: US 9,608,676 B2
(45) Date of Patent: Mar. 28, 2017

(54) DIGITAL PRE-DISTORTION SYSTEMS IN TRANSMITTERS

(71) Applicant: ANALOG DEVICES TECHNOLOGY, Hamilton (BM)

(72) Inventor: Dong Chen, Beijing (CN)

(73) Assignee: ANALOG DEVICES GLOBAL, Hamilton (BM)

( * ) Notice: Subject to any disclaimer, the term of this patent is extended or adjusted under 35 U.S.C. 154(b) by 52 days.

(21) Appl. No.: 13/940,263

(22) Filed: Jul. 12, 2013

(65) Prior Publication Data
US 2015/0016567 A1 Jan. 15, 2015

(51) Int. Cl.
| H04B 1/04 | (2006.01) |
| H03F 1/32 | (2006.01) |
| H03F 3/195 | (2006.01) |
| H03F 3/24 | (2006.01) |

(52) U.S. Cl.
CPC ......... *H04B 1/0475* (2013.01); *H03F 1/3247* (2013.01); *H03F 1/3258* (2013.01); *H03F 1/3282* (2013.01); *H03F 3/195* (2013.01); *H03F 3/245* (2013.01); *H03F 2200/111* (2013.01); *H03F 2201/3206* (2013.01); *H03F 2201/3209* (2013.01); *H03F 2201/3212* (2013.01); *H03F 2201/3224* (2013.01); *H03F 2201/3233* (2013.01); *H04B 2001/0425* (2013.01)

(58) Field of Classification Search
USPC .................................................. 375/297, 300
See application file for complete search history.

(56) References Cited

U.S. PATENT DOCUMENTS

| 2003/0156658 A1 | 8/2003 | Dartois |
| 2008/0063039 A1* | 3/2008 | Santhoff et al. ............... 375/227 |
| 2009/0264089 A1* | 10/2009 | Suzuki et al. ............. 455/114.3 |
| 2011/0135034 A1 | 6/2011 | Mujica et al. |
| 2011/0227770 A1 | 9/2011 | Kaper et al. |
| 2013/0094610 A1 | 4/2013 | Ghannouchi et al. |
| 2013/0094612 A1* | 4/2013 | Kim et al. .................... 375/297 |
| 2014/0161207 A1* | 6/2014 | Teterwak ...................... 375/297 |

FOREIGN PATENT DOCUMENTS

| EP | 1835685 | 9/2007 |
| WO | 2011/072137 | 6/2011 |

OTHER PUBLICATIONS

Extended European Search Report for EP Application No. 14175079.4 mailed Nov. 21, 2014, 9 pages.

(Continued)

*Primary Examiner* — Kabir A Timory
(74) *Attorney, Agent, or Firm* — Patent Capital Group

(57) ABSTRACT

Various digital pre-distortion systems for use in transmitters are disclosed. The digital pre-distortion system comprises an observing path, which performs either undersampling or radio frequency sampling of the output of a power amplifier. Undersampling may be performed at a rate, which causes aliasing to occur in the undersampled frequency domain. Both undersampling and radio frequency sampling reduces the complexity of the digital pre-distortion system by removing any down mixing modules or anti-aliasing modules, while maintaining reasonable performance of the digital pre-distortion systems.

20 Claims, 6 Drawing Sheets

(56) References Cited

OTHER PUBLICATIONS

Cidronali A. et al., "A New Approach for Concurrent Dual-Band IF Digital Pre-Distortion: System Design Analysis", Integrated Non-linear Microwave and Millimetre-Wave Circuits, 2008, INMMIC 2008, Workshop on IEEE, Piscataway, NJ, USA, Nov. 24, 2008, pp. 127-130.
Response to Office Action issued in EP Application Serial No. 14175079.4 filed Sep. 18, 2015, 3 pages.
Office Action issued in European Patent Application Serial No. 14175079.4 mailed Oct. 9, 2015, 5 pages.
Response to Extended European Search Report for EP Patent Application Serial No. 14175079.4 filed Apr. 8, 2015, 14 pages.
Office Action issued in European Patent Application Serial No. 14175079.4 mailed Jun. 19, 2015, 5 pages.

\* cited by examiner

DIGITAL PRE-DISTORTION SYSTEMS IN TRANSMITTERS

TECHNICAL FIELD OF THE DISCLOSURE

The present disclosure relates generally to digital pre-distortion and, more particularly, to the radio frequency (RF) sampling and subsampling in digital pre-distortion in base transceiver station systems.

BACKGROUND

Mobile communication networks rely on mobile base transceiver stations (BTSs) to facilitate wireless communication between user equipment and a network. BTSs receive and transmit signals between user equipment and the network, and one component of a BTS is its power amplifier (PA). The PA is configured to amplify weak signals without adding distortion. The PA is usually power hungry, typically consuming 30% (or more) of total power. Furthermore, the PA is expensive, usually making up 30% (or more) of the total cost of the BTS.

One characteristic of a power amplifier is that when the input power is relatively small, the output power is also relatively small. In this operating zone, the PA behaves linearly, but the PA is not very efficient. When the input power is relatively high, the output power is also high. In this operating zone, the PA is very efficient, but the PA loses its linearity. Such non-linearity generates undesirable effects in the signal itself as well as in adjacent channels. The problem is particularly significant when PAs are used in mobile BTSs because of mobile communication standards often use non-constant envelop modulation techniques. Thus, the PA in the BTSs ought to achieve high efficiency and linearity over a large amplitude range to maintain high adjacent channel leakage ratio (ACLR) and low error vector magnitude (EVM). While solutions have been used to correct the non-linearity effect, the issue resulting from the non-linearity remains hard to correct because, among other things, the effect depends on the previous signal in the time domain (a memory effect).

OVERVIEW

The present disclosure relates generally to digital pre-distortion systems. Corresponding digital pre-distortion systems are also disclosed.

Single-Band Scenario

A digital pre-distortion system for observing and correcting the non-linearity of a power amplifier in a transmitter is disclosed. The transmitter is configured to transmit a single-band signal with an upper cut-off frequency $f_H$. The system comprises an observing path and a digital signal processing module. The observing path is configured to sample the output signal of the power amplifier, and a digital signal processing module is configured to measuring and/or correcting the non-linearity of the power amplifier.

According to one aspect, the observing path comprises a radio frequency (RF) analog-to-digital converter (ADC) configured to (1) sample the output signal of the power amplifier at a sampling rate $f_s \geq 2f_H$ to produce a digital signal; and (2) provide the digital signal to the digital signal processing module to measure and/or correct the non-linearity of the power amplifier. Advantageously, the signal is directly sampled at or above Nyquist rate and the need to use a down mixing module or an anti-aliasing module (which are typically used in the observing path of a digital pre-distortion systems) is eschewed. The digital signal processing module is then configured to down sample the digital signal in the digital domain. Taking advantage of the nature of the learning architecture in a digital pre-distortion system in a transmitter where the signal being transmitted towards the power amplifier is known, the digital signal processing module is configured to remove artifacts and/or noise caused by the sampling process of the RF ADC through an adaptive algorithms engine in the digital signal processing module configured to compare the single-band signal being transmitted in a path towards the power amplifier and the digital signal.

Multi-Band Scenario

A digital pre-distortion system for observing and correcting the non-linearity of a power amplifier in a transmitter, the transmitter configured to transmit M multi-band signals having respective bandwidths $B_1 = f_{H1} - f_{L1}, \ldots B_m = f_{HM} - f_{LM}$, where $f_{H1} \ldots f_{HM}$ are the respective upper cut-off frequencies of the M bands and $f_{L1} \ldots f_{LM}$ are the respective lower cut-off frequencies of the M bands. The system comprises an observing path and a digital signal processing module. the observing path is configured to sample the output signal of the power amplifier, and the digital signal processing module for measuring and/or correcting the non-linearity of the power amplifier.

In a first embodiment, the observing path includes a radio frequency (RF) analog-to-digital converter (ADC) configured to sample the output signal of the power amplifier at a sampling rate $f_s \geq 2f_{HM}$ to produce a multi-band digital signal. The RF ADC is further configured to provide the multi-band digital signal to the digital signal processing module to measure and/or correct the non-linearity of the power amplifier In a second embodiment, the observing path includes an undersampling analog-to-digital converter (ADC) configured to sample the output signal of the power amplifier at a sampling rate $f_S$ to produce a undersampled multi-band digital signal, wherein $f_S = f_{S1} \cap f_{S2} \cap \ldots \cap f_{SM}$ and $f_{S1} \ldots f_{SM}$ are computed for each band by calculating $$\frac{2f_{Hk}}{n} \leq f_{Sk} \leq \frac{2f_{Lk}}{n-1}$$

where $$1 \leq n \leq \left\lfloor \frac{f_{Hk}}{B_k} \right\rfloor, 1 \leq k \leq M.$$

In particular, the undersampled multi-band digital signal has a characteristic where some overlap between the M bands exists in the frequency domain. The undersampling ADC is further configured to provide the undersampled multi-band digital signal to the digital signal processing module to measure and/or correct the non-linearity of the power amplifier for the M multi-band signals. The digital signal processing module may be further configured to down sample the digital signal in the digital domain.

In both the first and second embodiments, the observing path advantageously excludes a down mixing module and/or an anti-aliasing module. The complexity and cost of the digital pre-distortion system are effectively reduced. Furthermore, the digital signal processing module is configured to remove artifacts and/or noise caused by the sampling process of the RF ADC or the undersampling ADC through an adaptive algorithms engine configured to compare known multi-band signals being transmitted in a path towards the power amplifier and the multi-band digital signal or the undersampled multi-band digital signal respectively. Advantageously, the reduction in complexity does not sacrifice the workability of the digital pre-distortion system.

According to one aspect, a multi-band separation engine is provided to separate the multi-band digital signal into M separate bands. In one embodiment, a multi-band separation engine configured to separate the multi-band digital signal or the undersampled multi-band digital signal into M separated bands using known multi-band signals being transmitted in a path towards the power amplifier respective to the M bands. The nature of correlating the known signal being transmitted towards the power amplifier with the observed signal (i.e., the multi-band digital signal or the undersampled multi-band digital signal) advantageously allows overlapping bands and images to be separated. By allowing overlapping bands, there is more freedom to choose the sampling rate of the ADC, and in some cases, allow slower ADCs to be used than ADCs, which were chosen to avoid any overlapping/aliasing.

In the embodiment where an RF sampling ADC is used, a multi-band separation engine is configured to separate the multi-band digital signal into M separated bands using bandpass filters.

It is envisioned that in some embodiments, a multi-band separation engine is not used, and the multiband digital signal is processed by the adaptive algorithms to compare the known multi-band signals being transmitted in a path towards the power amplifier and the multiband digital signal to measure and/or correct the non-linearity of the power amplifier.

After separating the digital multi-band signal or the undersampled multi-band signal into M separated bands, at least two adaptive algorithms engines may be provided in the digital signal processing module to process the M separated bands in parallel to compare at least one known multi-band signals being transmitted in a path towards the power amplifier and at least one respective separated bands to measure and/or correct the non-linearity of the power amplifier. Or in some cases, the digital signal processing module comprises one or more adaptive engines configured to process the M separated bands in one band at a time or a subset of bands at a time to compare at least one known multi-band signals being transmitted in a path towards the power amplifier and at least one respective separated bands to measure and/or correct the non-linearity of the power amplifier.

DESCRIPTION OF EXAMPLE EMBODIMENTS OF THE DISCLOSURE

A digital pre-distortion (DPD) system is typically implemented in the base transceiver station (BTSs) to alleviate the non-linearity issue of the power amplifier while keeping the power amplifier in the high efficiency operating zone. DPD systems observes the output signal of the power amplifier and corrects the non-linearity of the output signal observed.

Figure 1:
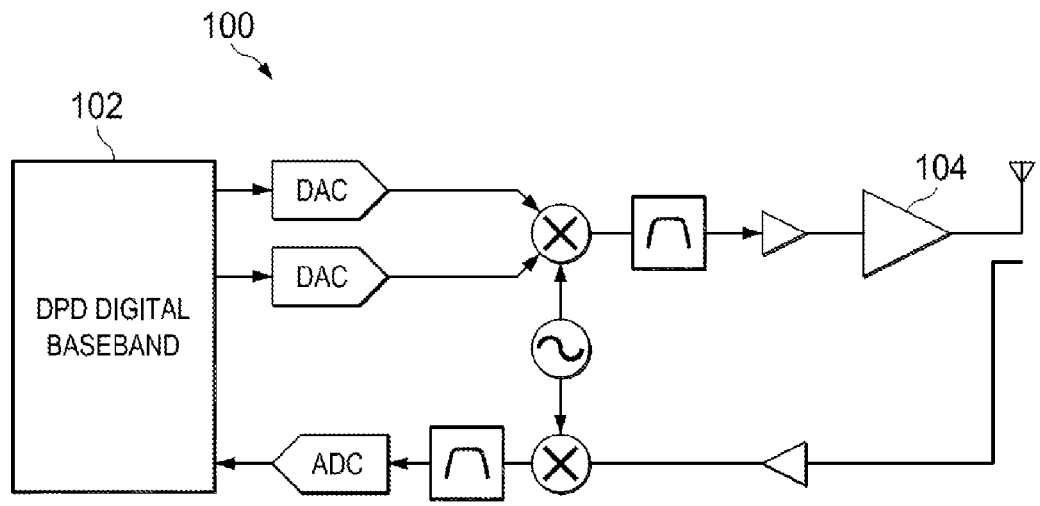
FIG. 1 is a simplified schematic diagram illustrating a system architecture of typical digital pre-distortion system.

Referring to FIG. 1, a typical digital pre-distortion (DPD) system 100 is a loop back system having a forward path (signal path in the top part of the figure) and an observing path (signal path in the bottom part of the figure). In the forward path, signals are provided from the DPD digital baseband 102 towards (the input of) a power amplifier (PA) 104, which the DPD system aims to correct for non-linearity. In the observing path, the output signal of the power amplifier 104 is observed. Typically, the observing path includes a down mixing module (a down mixer to convert the output signal of the power amplifier to an intermediate frequency (IF) and/or an anti-aliasing module (or filter) prior to sampling that signal using an analog-to-digital converter (ADC). The down mixing module and the anti-aliasing module adds complexity and cost to the system.

Using the observing path, the non-linearity of the output signal can be observed based on the known signal transmitted in the forward path and the output signal of the power amplifier (e.g., by comparing the two signals). The non-linearity of the output signal can be modeled and an inverse response to the non-linearity can be generated in the DPD digital baseband 102. Using the inverse response, the non-linearity can be compensated in the DPD digital baseband 102 by pre-distorting the (transmit) signal in the forward path using the inverse response. Accordingly, the resulting response of the pre-distorted signal would exhibit a linear response.

The modeling of the non-linearity may be performed in different ways. One way to model the non-linearity is to use a look up table (LUT). An LUT may be used to store the inverse response of the PA. Generally, two tables are used for pre-distortion, one for amplitude mapping, and the other for phase mapping. Although the LUT model is simple to implement, it is hard to handle the memory effect exhibited by the PA (caused by the electrical response of the components inside the PA), where the current output signal of the PA is also affected by the previous input signals. A larger LUT (or more LUTs) may be used to also include an input index for previous signal inputs, but such a solution is not practicable because the table size would increase exponentially.

Figure 2:
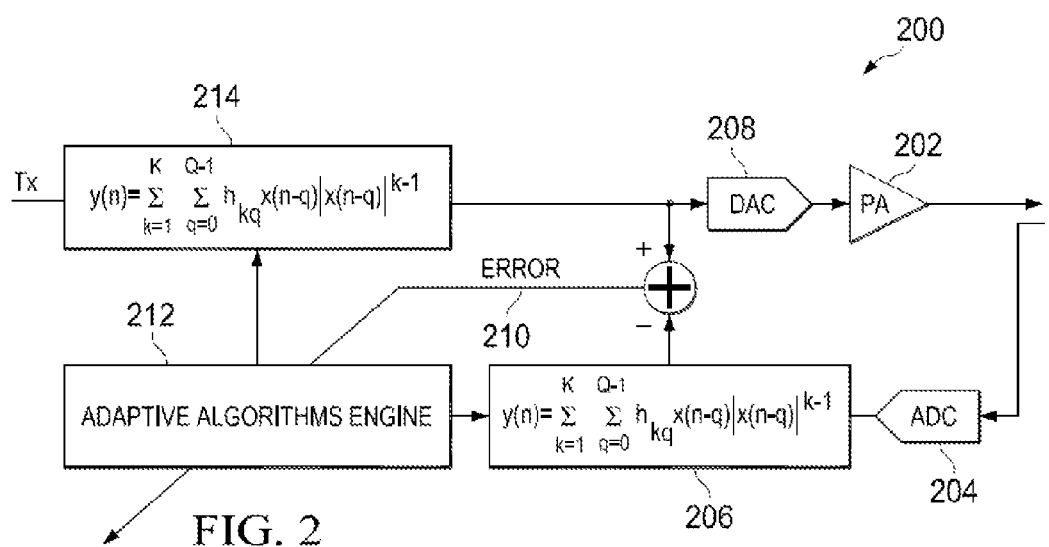
FIG. 2 is a simplified schematic diagram illustrating the exemplary architecture of a digital pre-distortion system, according the some embodiments of the disclosure.

Another way to model the non-linearity of the PA is to use a polynomial model. A polynomial model can easily take the memory effect into consideration by adding polynomial items from previous time domain samples. FIG. 2 is a simplified schematic diagram illustrating the learning architecture 200 of a digital pre-distortion system according the some embodiments of the disclosure, which uses the polynomial model. The output signal of the power amplifier 202 is coupled back in an observation path signal chain and is captured into the digital domain by an ADC 204. The captured information (i.e., output of the ADC) is fed to a non-linear filter 206, where the captured information is modeled using, e.g., the polynomial. The output of the non-linear filter 206 is then compared with the known transmit signal (e.g., the desired signal, such as the input to the DAC 208) to determine the error 210. The error is provided to an adaptive algorithms engine 212 which would update the coefficient of the non-linear filter 206 used for pre-distorting the transmit signal. This update may be performed in an iterative manner. When the adaptive algorithms engine converges, the error signal 208 would be small (made as small as reasonably possible) and the non-linear filter 206 would be calibrated to have an inverse response of the non-linear response of the PA 202. The calibrated non-linear filter 206 is then placed as non-linear filter 214 in the forward path of the system to pre-distort the transmit signal. Accordingly, the response of the calibrated non-linear filter 214 combined with the response of PA 202 would generate a linear response. Consequently, the combined response of the pre-distorted transmit signal to the PA 202 and the response of the non-linear PA 202 would result in a linear response at the output of the PA.

The adaptive algorithms engine may utilize a least mean squares, least squares, recursive least squares, or Kalman algorithm to minimize/reduce the error. It is envisioned that other error minimization adaptive algorithms suitable for this purpose may be used. Although the present disclosure discusses using LUTs and polynomial models, other suitable models may be used, such as the more complex Volterra series model or Factor Graph model. Furthermore, although an "inverse learning architecture" for learning the "inverse" of the non-linearity is discussed herein, it is envisioned that other types of learning architectures can be used, such as LUT and forward learning architectures.

In the past few years, demand for higher bandwidth continues to rise for the next generation BTS. From the days of GSM where only 200 Kilohertz bandwidth is required, more recently some companies now desire to implement applications where over 100 megahertz bandwidth is required to support for multi-carrier, multi-band, multi-standard scenarios. In the typical DPD systems (such as one shown in FIG. 1), the observing path would normally sample at least 5 times the signal bandwidth in order to capture the non-linearity in the output signal of the power amplifier. For a signal with 100 megahertz bandwidth, the DPD system would need a 1 Gigahertz ADC (relatively high speed). Such an ADC may not be desirable in some cases due to its complexity and cost.

It has been discovered that the DPD system can be improved to simplify the DPD system in a transmitter without substantially sacrificing the performance of DPD system to measure and correct the non-linearity of a power amplifier. Furthermore, the improved DPD system can meet the demands of the market for higher bandwidth.

Figure 3:
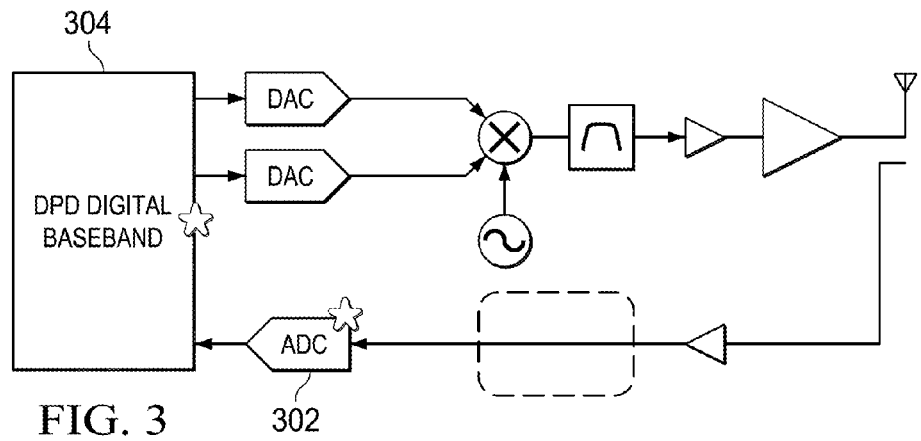
FIG. 3 is a simplified schematic diagram illustrating an improved system architecture of a digital pre-distortion system according to some embodiments of the disclosure.

FIG. 3 is a simplified schematic diagram illustrating an improved system architecture of a digital pre-distortion system according to some embodiments of the disclosure. By removing the down mixing module and the anti-aliasing module (denoted by the box with the dotted outline) in the observing path, the architecture of the DPD system is simplified (when compared to FIG. 1). Such a DPD system may be implemented in different ways, by utilizing different types of ADCs and mechanisms in the DPD digital baseband, which will be further explained in detail in FIGS. 6-8. In brief, either an undersampling ADC may be used or an RF sampling ADC which directly samples the signal may be used. The DPD digital baseband would be configured to work with the particular type of ADC used.

Undersampling (sometimes referred to in literature as bandpass sampling) in the context of this disclosure means sampling a bandpass filtered or band-limited signal at a sample rate below the Nyquist rate (i.e., twice the upper cut-off frequency of the bandpass signal). Although sampling is performed below the Nyquist rate, undersampling of a bandpass filtered or a band-limited signal still enables the bandpass filtered or the band-limited signal to be reconstructed, and accordingly the undersampled signal may be used for correcting and/or measuring the non-linearity of the power amplifier.

Figure 4:
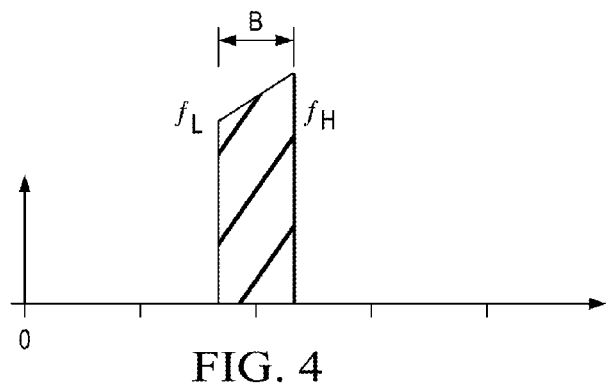
FIG. 4 is a simplified plot in the frequency domain of a signal in a single-band scenario.

FIG. 4 is a simplified plot in the frequency domain of a signal in a single-band scenario in a transmitter. The horizontal axis presents frequency and the vertical axis represents magnitude and/or energy. The bar shown illustrates a simplified representation of a single-band signal having a bandwidth B. The signal-band has a lower cut-off frequency $f_L$ and an upper cut-off frequency $f_H$. Accordingly the bandwidth of the single-band signal is $f_H-f_L$.

Figure 5:
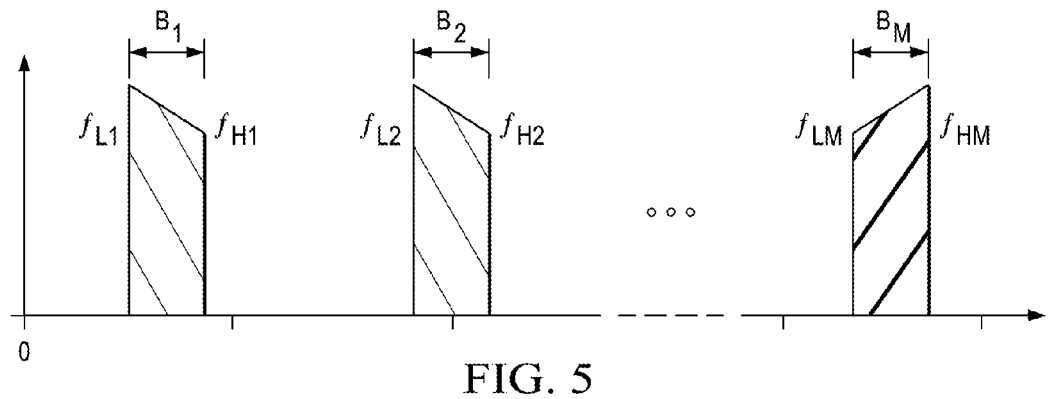
FIG. 5 is a simplified plot in the frequency domain of M multi-band signals.

FIG. 5 is a simplified plot in the frequency domain of M multi-band signals. The horizontal axis presents frequency and the vertical axis represents magnitude and/or energy. The M signals in the multi-band scenario, represented as bars in the plot, has respective bandwidths: $B_1=f_{H1}-f_{L1}, \ldots B_m=f_{HM}-f_{LM}$, where $f_{H1} \ldots f_{HM}$ are the respective upper cut-off frequencies of the M bands and $f_{L1} \ldots f_{LM}$ are the respective lower cut-off frequencies of the M bands.

Figure 6A:
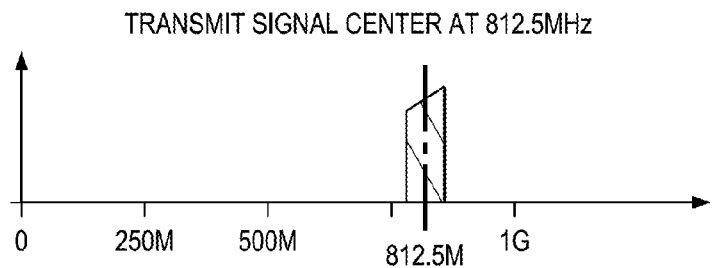
FIGS. 6A-C illustrate the exemplary sampling mechanisms in the frequency domain for the single-band scenario, according to some embodiments of the disclosure.
Figure 6B:
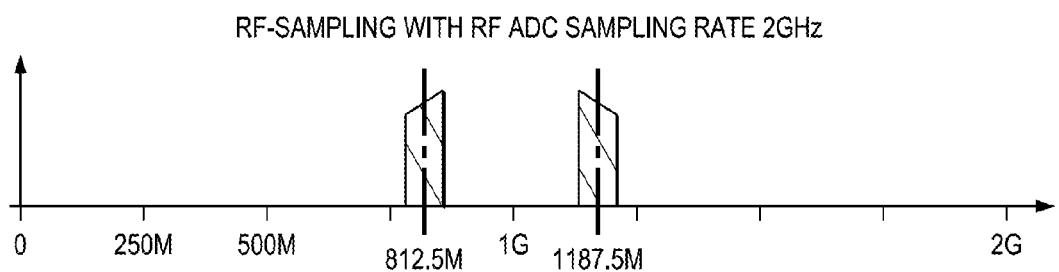
Figure 6C:
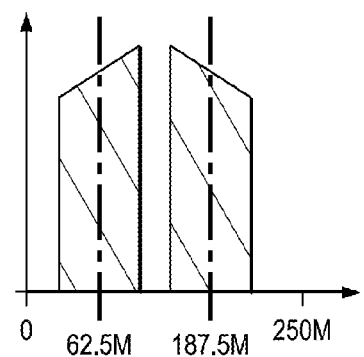

FIGS. 6A-C illustrate the exemplary sampling mechanisms in the frequency domain for the single-band scenario, according to some embodiments of the disclosure. To illustrate the improved digital pre-distortion system, a particular single band example with 100 megahertz bandwidth being transmitted at a center at 812.5 megahertz is explained and the single-band signal is shown in the frequency domain in FIG. 6A. It is envisioned that the signal band may have other bandwidths or signal centers can be used with the disclosed embodiments. There are two illustrative ways to sample the signal in a DPD system of a transmitter, in particular, in the observing path.

One way to sample the signal in the observing path of the DPD system in a transmitter is to use a radio frequency (RF) analog-to-digital converter (ADC). The RF ADC in the observing path of the transmitter is configured to sample the output signal of the power amplifier at a sampling rate $f_s \geq 2f_H$ ($2f_H$ being the Nyquist rate=twice the upper cut-off frequency, as seen in FIG. 4) produce a digital signal. In this example, the output signal of the power amplifier is sampled at 2 Gigahertz, and digital signal is shown in the frequency domain in FIG. 6B. As seen in the figure, the digital signal centered at 812.5 megahertz has an image centered at 1187.5 megahertz. The digital signal is then provided from the RF ADC to the digital signal processing module to measure and/or correct the non-linearity of the power amplifier. The need to have a down mixing module is obviated, thereby reducing the complexity of the system. In normal receivers, the requirement of a high Q anti-aliasing filter to filter out the unwanted channels stopped the usage of RF sampling. However, in the observation path of DPD system, it can take the advantage of the knowledge of the transmitting signal, so that the high Q filtering is not necessary. Furthermore, the removal of the IF stage reduce the system cost and reduce the complexity of frequency plan, make the system easier to be software upgradable.

The digital signal processing module in the RF sampling case is configured to down sample the digital signal in the digital domain, e.g., to a lower sampling rate and match the sampling rate with the transmitter sampling rate to perform the adaptive algorithms in pre-distorting the signal. Furthermore, the digital signal processing module is configured to remove any artifacts and/or noise caused by the sampling process. The digital signal processing module can do so effectively because in a DPD system for a transmitter, the desired signal being transmitted towards the power amplifier is known. Therefore, the digital signal processing module can use the adaptive algorithm engine in the digital signal processing module to compare the single-band signal being transmitted in the forward path towards the power amplifier and the digital signal to remove any artifacts and/or noise caused by the RF sampling ADC.

Another way is to undersample the signal in the observing path of the DPD system in a transmitter using a relatively low speed ADC. An undersampling ADC may be used to sample the output of the power amplifier at a rate that is less than twice the upper cut-off frequency of the single-band signal. For instance, the output signal of the power amplifier may be sampled at a rate of 250 megahertz for the example shown in FIG. 6A. The result of the undersampled digital signal in the frequency domain is illustrated in FIG. 6C, where the signal itself and its image is now centered at 62.5 megahertz and 187.5 megahertz respectively.

It has been realized that undersampling works well in this single-band scenario because the transmit signal can be constructed from the undersampled digital signal, and any noise and/or artifacts caused by the undersampling ADC (e.g., noise which folds back onto the images) can be effectively removed by the digital signal processing module. There is also no interference that could have been caused in other channels in the single-band scenario. The image may also be filtered out in the digital domain. Specifically, the digital signal processing module can use an adaptive algorithms engine in the digital signal processing module to compare the single-band signal being transmitted in the forward path towards the power amplifier and the undersampled digital signal to remove at least some of the noise and/or artifacts caused by the undersampling ADC.

Figure 7A:
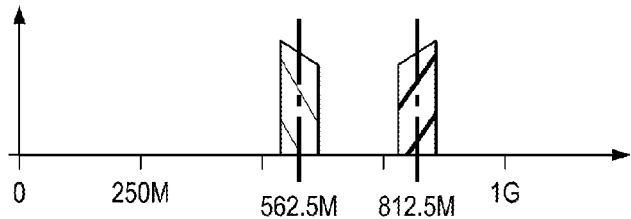
FIGS. 7A-C illustrate the exemplary sampling mechanisms in the frequency domain for the multi-band scenario, according to some embodiments of the disclosure.
Figure 7B:
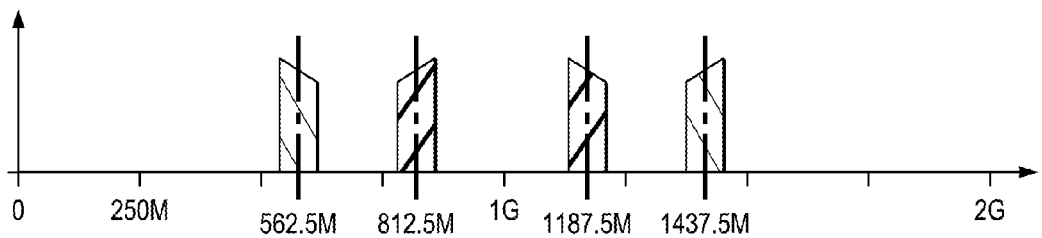
Figure 7C:
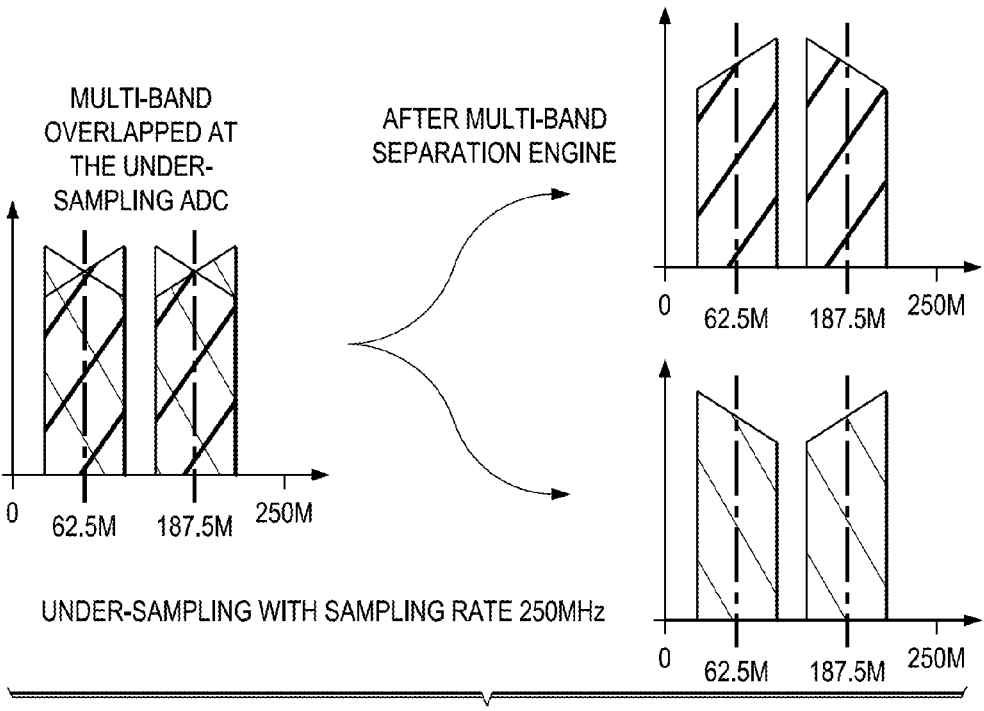

FIGS. 7A-C illustrate the exemplary sampling mechanisms in the frequency domain for the multi-band scenario, according to some embodiments of the disclosure. To illustrate the improved digital pre-distortion system, a particular multi-band example with two bands with 100 megahertz being transmitted at a first center at 562.5 megahertz and a second center at 812.5 megahertz is explained and the multi-band signal is shown in the frequency domain in FIG. 7A. There are two illustrative ways to sample the signal in a DPD system of a transmitter, in particular, in the observing path.

One way to sample the signal in the observing path of the DPD system in a transmitter is to use a radio frequency (RF) analog-to-digital converter (ADC). The RF ADC in the observing path of the transmitter is configured to sample the output signal of the power amplifier at a sampling rate $f_S \geq 2f_{HM}$ ($2f_{HM}$ being twice the upper-cut off frequency of the band centered at the highest frequency, as seen in FIG. 5) produce a multi-band digital signal. In this example, the output signal of the power amplifier is sampled at 2 Gigahertz, and multi-band digital signal is shown in the frequency domain in FIG. 7B. As seen in the figure, the multi-band digital signal has its respective images, one centered at 1187.5 megahertz, and another at 1437.5 megahertz (a total of 4 bands are seen in the multi-band digital signal=two original channels and two images). The multi-band digital signal is then provided from the RF ADC to the digital signal processing module to measure and/or correct the non-linearity of the power amplifier.

The digital signal processing module in the RF sampling case is configured to down sample the digital signal in the digital domain. The digital signal processing module may employ a bandpass filter (e.g., in a multi-band separation engine) to separate the multi-band digital signal into M separated bands. Furthermore, the digital signal processing module is configured to remove any artifacts and/or noise caused by the sampling process. The digital signal processing module can do so effectively because in a DPD system for a transmitter, the desired signal being transmitted towards the power amplifier is known. Therefore, the digital signal processing module can use the adaptive algorithm engine in the digital signal processing module to compare the multi-band signal being transmitted in the forward path towards the power amplifier and the digital signal to remove any artifacts and/or noise caused by the RF sampling ADC.

Another way is to undersample the signal in the observing path of the DPD system in a transmitter using a relatively low speed ADC. An undersampling ADC may be used to sample the output of the power amplifier at a sampling rate $f_S$ to produce an undersampled multi-band digital signal, wherein $f_S = f_{S1} \cap f_{S2} \cap \ldots \cap f_{SM}$ and $f_{S1} \ldots f_{SM}$ are computed for each band by calculating $$\frac{2f_{Hk}}{n} \leq f_{Sk} \leq \frac{2f_{Lk}}{n-1}$$

where $$1 \leq n \leq \left[\frac{f_{Hk}}{B_k}\right], 1 \leq k \leq M$$

(notation is illustrated in FIG. 5).

The undersampled multi-band digital signal has a characteristic where some overlap between the M bands exists in the frequency domain, as seen in the plot on the left in FIG. 7C when the multi-band signal shown in FIG. 7A is undersampled at, e.g., 250 megahertz. The undersampled multi-band digital signal is then provided to the digital signal processing module to measure and/or correct the non-linearity of the power amplifier for the M multi-band signals. The exemplary result of the undersampled multi-band digital signal in the frequency domain is illustrated in the plot on the left in FIG. 7C, where the multi-band signal and its multi-band image overlap at frequencies near 62.5 megahertz and 187.5 megahertz.

The overlapping/aliasing characteristic may be mathematically defined. Suppose $f_{C1} \ldots f_{CM}$ are the respective signal center frequencies of the M bands prior to undersampling. Let $f'_{C1} \ldots f'_{CM}$ be defined as the respective signal center frequencies of the M bands and $f'_{iC1} \ldots f'_{iCM}$ be the respective signal center frequencies of the M images, after undersampling in the digital domain using $f_S$ as the sampling frequency. The respective signal center frequencies of the M bands after undersampling is thus $f'_{Ck} = f_{Ck} - nf_S$ where $1 \leq k \leq M$ and n is selected to satisfy $0 \leq f'_C < f_S$. The respective signal center frequencies of the M images after under sampling is $f'_{iCk} = -f_{Ck} + nf_S$ where $1 \leq k \leq M$ and n is selected to satisfy $0 \leq f'_{iC} < f_S$. If any two bands j,k from the M bands match the following conditions, overlapping/aliasing will occur:

$$|f'_{Cj} - f'_{Ck}| < \max\left(\frac{B_j}{2}, \frac{B_k}{2}\right)$$

or $$|f'_{Cj} - f'_{iCk}| < \max\left(\frac{B_j}{2}, \frac{B_k}{2}\right)$$

where $$1 \le j \le M, 1 \le k \le M, j \ne k.$$

It is envisioned that the above mathematical formulation may also be defined in terms of the upper and lower cut-off frequency of the respective M bands and their images.

Note that there is no requirement in the sampling frequency to ensure that there is no overlapping or aliasing in the resulting undersampled multi-band digital signal. In some embodiments, the sampling rate is chosen to allow or ensure that some overlapping or aliasing does exist for the undersampled multi-band signal in the frequency domain. By allowing overlapping of the bands and their images in the undersampled multi-band digital signal in the frequency domain, the sampling rate can, in some cases be slower than a rate, which does not allow overlapping/aliasing. Sampling at a slower rate advantageously reduces the complexity and cost of the digital pre-distortion system. Furthermore, by removing such a limitation of avoiding any overlapping/aliasing, a digital pre-distortion system designer is freer to choose the ADC for a particular system.

Some overlap between the bands is allowed in the undersampled multi-band digital signal because a multi-band separation engine may be provided in the digital signal processing module. It was discovered that because the multi-band signal being transmitted towards the power amplifier is known in a digital pre-distortion observing path of a transmitter, the multi-band separation engine can separate the overlapping bands in the undersampled multi-band digital signal (or the RF sampled multi-band digital signal, if desired) into the M separated bands. The multi-band separation engine works by correlating the known signal transmitted towards the power amplifier and the observed signal from the output of the power amplifier.

It has been realized that undersampling works well in this multi-band scenario because the transmit signal can be constructed from the undersampled multi-band digital signal, and any noise and/or artifacts caused by the undersampling ADC (e.g., noise which folds back onto the images) can be effectively removed by the digital signal processing module. Specifically, the digital signal processing module can use an adaptive algorithms engine in the digital signal processing module to compare the known multi-band signal being transmitted in the forward path towards the power amplifier and the undersampled multi-band digital signal to remove at least some of the noise and/or artifacts caused by the undersampling ADC.

Figure 8A:
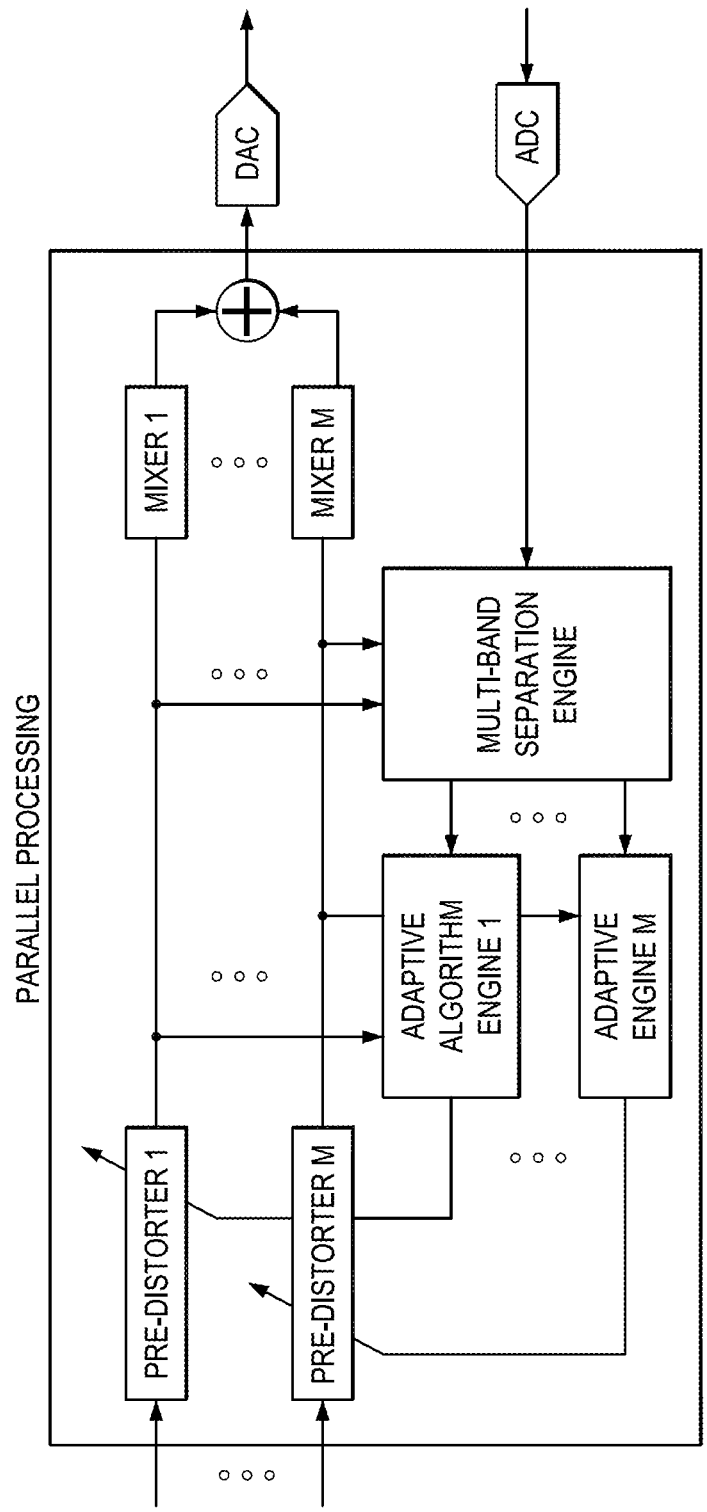
FIGS. 8A and 8B are simplified schematic diagrams of the digital signal processing module for the multi-band scenario, according to some embodiments of the disclosure.
Figure 8B:
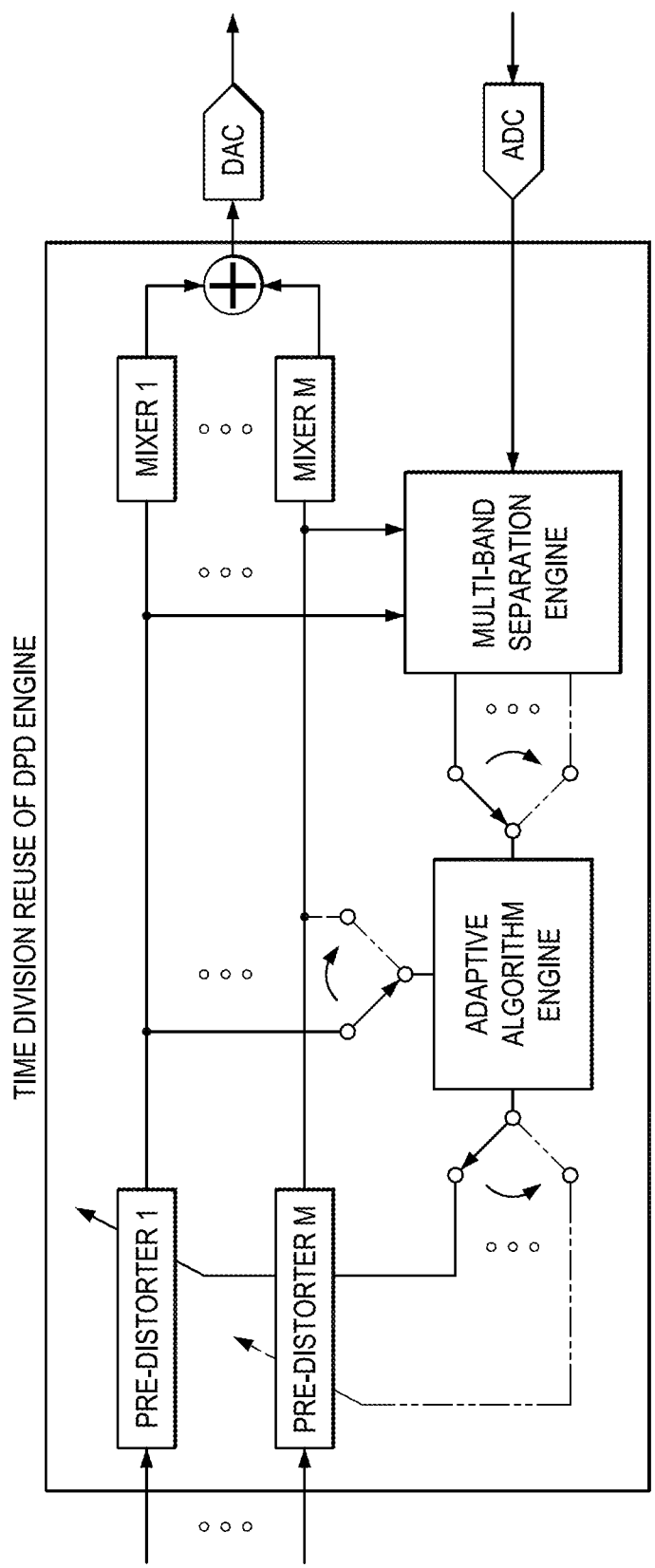

FIGS. 8A and 8B are simplified schematic diagrams of the digital signal processing module for the multi-band scenario, according to some embodiments of the disclosure. Irrespective of whether an RF sampling ADC is used or an undersampling ADC is used, a digital signal processing module can in parallel or in a time-division type of way the separated bands of the multi-band digital signal. A multi-band separation engine is provided in both digital signal processing module to separate the bands present in the digital multi-band signal from the output of the ADC (RF or undersampling ADC).

In one embodiment, the separated bands from the output of the multi-band separation engine may be provided in parallel or concurrently to a plurality of adaptive algorithm engines to correlate/compare known multi-band signals being transmitted towards the power amplifier with the respective separated bands. In another embodiment, one or a subset of the separated bands from the output of the multi-band separation engine may be provided one band at a time or a subset of bands at a time to allow the same adaptive algorithms engine to be reused in a time division type of way for a plurality of separated bands. In some embodiment, a hybrid combination of both by processing some bands in parallel and some bands in a time division type of way is also envisioned. Time division and reuse of the adaptive algorithm engine is allowed because the adaptive algorithms engine does not have to run in real time, but rather, the engine is run every now and then to calibrate the pre-distorters 1 through M (where the amount of time it takes to process all the bands of the multi-band digital signal in the adaptive algorithm stage is not a key design requirement).

Generally speaking, the capacitors, clocks, DFFs, dividers, inductors, resistors, amplifiers, switches, digital core, transistors, and/or other components within the disclosed embodiments can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the amplification functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that the activities discussed above with reference to the FIGURES are applicable to any integrated circuits that involve signal processing, particularly those that can execute specialized software programs, or algorithms, some of which may be associated with processing digitized real-time data. Certain embodiments can relate to multi-DSP signal processing, floating point processing, signal/control processing, fixed-function processing, microcontroller applications, etc.

In certain contexts, the features discussed herein can be applicable to any correction system, for example, non-linear correction system/noise correction system/spur correction system. Example of those applications are: wireless and wired communications, audio and video equipment, industrial instruments, consumer portable/mobile device.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

OTHER NOTES, EXAMPLES, AND IMPLEMENTATIONS

Note that all optional features of the apparatus described above may also be implemented with respect to the method or process described herein and specifics in the examples may be used anywhere in one or more embodiments.

In a first example, a system is provided (that can include any suitable circuitry, dividers, capacitors, resistors, inductors, ADCs, DFFs, logic gates, software, hardware, links, etc.) that can be part of any type of computer, which can further include a circuit board coupled to a plurality of electronic components. The system can include means for clocking data from the digital core onto a first data output of a macro using a first clock, the first clock being a macro clock; means for clocking the data from the first data output of the macro into the physical interface using a second clock, the second clock being a physical interface clock; means for clocking a first reset signal from the digital core onto a reset output of the macro using the macro clock, the first reset signal output used as a second reset signal; means for sampling the second reset signal using a third clock, which provides a clock rate greater than the rate of the second clock, to generate a sampled reset signal; and means for resetting the second clock to a predetermined state in the physical interface in response to a transition of the sampled reset signal.

The 'means for' in these instances (above) can include (but is not limited to) using any suitable component discussed herein, along with any suitable software, circuitry, hub, computer code, logic, algorithms, hardware, controller, interface, link, bus, communication pathway, etc. In a second example, the system includes memory that further comprises machine-readable instructions that when executed cause the system to perform any of the activities discussed above.

What is claimed is:

1. A digital pre-distortion circuitry for observing and correcting non-linearity in a transmitter, the digital pre-distortion circuitry comprising:
   an observing path configured to sample a multi-band output signal of a power amplifier, said observing path comprising a radio frequency (RF) analog-to-digital converter (ADC) configured to sample the multi-band output signal of the power amplifier at a first sampling rate that is equal to or more than twice a highest upper cut off frequency of a band centered at a highest frequency of the multi-band output signal to produce a multi-band digital signal without overlapping between bands, wherein the observing path does not convert the multi-band output signal of the power amplifier to an intermediate frequency; and
   a digital signal processing circuit for down sampling, in a digital domain, the multi-band digital signal produced by the RF ADC to generate a down sampled multi-band digital signal having a sampling rate that matches the transmitter and is lower than the first sampling rate, and measuring the non-linearity of the power amplifier based on the down sampled multi-band digital signal.

2. The digital pre-distortion circuitry of claim 1, wherein: the observing path does not include an anti-aliasing filter.

3. The digital pre-distortion circuitry of claim 1, wherein: the digital signal processing circuit is configured to remove artifacts and/or noise caused by the sampling process of the RF ADC through an adaptive algorithms engine configured to compare known multi-band signals being transmitted in a path towards the power amplifier and the multi-band digital signal respectively.

4. The digital pre-distortion circuitry of claim 1, wherein the digital signal processing circuit comprises:
a multi-band separation engine comprising bandpass filters configured to separate the multi-band digital signal into separated bands.

5. The digital pre-distortion circuitry of claim 4, wherein the digital signal processing circuit further comprises at least two adaptive algorithms engines configured to process the separated bands in parallel to compare at least one known multi-band signals being transmitted in a path towards the power amplifier and at least one respective separated bands to measure and/or correct the non-linearity of the power amplifier.

6. The digital pre-distortion circuitry of claim 4, wherein the digital signal processing circuit further comprises one or more adaptive engines configured to process the separated bands one band at a time or a subset of the separated bands at a time to compare at least one known multi-band signals being transmitted in a path towards the power amplifier and at least one respective separated bands to measure and/or correct the non-linearity of the power amplifier.

7. The digital pre-distortion circuitry of claim 1, wherein: the digital signal processing module comprises a multi-band separation engine configured to separate the multi-band digital signal into M separated bands using known multi-band signals being transmitted in a path towards the power amplifier respective to the M bands.

8. The digital pre-distortion circuitry of claim 7, wherein the digital signal processing circuit further comprises at least two adaptive algorithms engines configured to process the separated bands in parallel to compare at least one known multi-band signals being transmitted in a path towards the power amplifier and at least one respective separated bands to measure and/or correct the non-linearity of the power amplifier.

9. The digital pre-distortion circuitry of claim 7, wherein the digital signal processing circuit further comprises one or more adaptive engines configured to process the separated bands one band at a time or a subset of the separated bands at a time to compare at least one known multi-band signals being transmitted in a path towards the power amplifier and at least one respective separated bands to measure and/or correct the non-linearity of the power amplifier.

10. The digital pre-distortion circuitry of claim 1, wherein the sampling rate is at least 2 gigahertz.

11. A digital pre-distortion method for observing and correcting non-linearity in a transmitter, the method comprising:
sampling a multi-band output signal of a power amplifier in an observing path by a radio frequency (RF) analog-to-digital converter (ADC) at a first sampling rate that is equal to or more than twice a highest upper cut off frequency of a band centered at a highest frequency of the multi-band output signal to produce a multi-band digital signal wherein sampling in the observing path does not include converting the multi-band the output signal of the power amplifier to an intermediate frequency, wherein sampling in the observing path does not include converting the multi-band the output signal of the power amplifier to an intermediate frequency; and
down sampling, by the digital signal processing circuit in a digital domain, the multi-band digital signal produced by the RF ADC to generate a down sampled multi-band digital signal having a sampling rate that matches the transmitter and is lower than the first sampling rate;
measuring, by the digital signal processing circuit, the non-linearity of the power amplifier using a signal being transmitted in a forward path and the down sampled multi-band digital signal; and
correcting, by the digital signal processing circuit, the non-linearity of the power amplifier.

12. The digital pre-distortion method of claim 11, wherein sampling in the observing path does not include an anti-aliasing filter.

13. The digital pre-distortion method of claim 11, further comprising:
removing, by the digital signal processing circuit, artifacts and/or noise caused by the sampling process of the RF ADC through an adaptive algorithms engine configured to compare known multi-band signals being transmitted in a path towards the power amplifier and the multi-band digital signal respectively.

14. The digital pre-distortion method of claim 11, further comprising:
separating the multi-band digital signal into separated bands by a multi-band separation engine comprising bandpass filters.

15. The digital pre-distortion method of claim 14, further comprising:
processing, by at least two adaptive algorithms engines of the digital signal processing circuit, the separated bands in parallel to compare at least one known multi-band signals being transmitted in a path towards the power amplifier and at least one respective separated bands to measure and/or correct the non-linearity of the power amplifier.

16. The digital pre-distortion method of claim 15, further comprising:
processing, by one or more adaptive engines of the digital signal processing circuit, the separated bands one band at a time or a subset of the separated bands at a time to compare at least one known multi-band signals being transmitted in a path towards the power amplifier and at least one respective separated bands to measure and/or correct the non-linearity of the power amplifier.

17. The digital pre-distortion method of claim 11, further comprising:
separating, by a multi-band separation engine in the digital signal processing module, the multi-band digital signal into M separated bands using known multi-band signals being transmitted in a path towards the power amplifier respective to the M bands.

18. The digital pre-distortion method of claim 17, further comprising:
processing, by at least two adaptive algorithms engines of the digital signal processing circuit, the separated bands in parallel to compare at least one known multi-band signals being transmitted in a path towards the power amplifier and at least one respective separated bands to measure and/or correct the non-linearity of the power amplifier.

19. The digital pre-distortion method of claim 17, further comprising:

processing, by one or more adaptive engines of the digital signal processing circuit, the separated bands one band at a time or a subset of the separated bands at a time to compare at least one known multi-band signals being transmitted in a path towards the power amplifier and at least one respective separated bands to measure and/or correct the non-linearity of the power amplifier.

20. A transmitter with digital pre-distortion for observing and correcting non-linearity in the transmitter, the apparatus comprising:

a forward path to transmit a multi-band signal towards a power amplifier, wherein the desired multi-band signal has a first sampling rate;

an observing path to sample a multi-band output signal of the power amplifier, said observing path comprising a radio frequency (RF) analog-to-digital converter (ADC) configured to sample the multi-band output signal of the power amplifier at a second sampling rate that is equal to or more than twice a highest upper cut off frequency of a band centered at a highest frequency of the multi-band output signal, wherein the observing path does not convert the multi-band output signal of the power amplifier to an intermediate frequency; and a digital signal processing circuit to lower the second sampling rate of the multi-band digital signal from RF ADC in a digital domain to generate a down sampled multi-band digital signal having a lower sampling rate that matches the first sampling rate and measuring the non-linearity of the power amplifier by comparing the multi-band signal in the forward path and the down sampled multi-band digital signal.

* * * * *